United States Patent
Luo et al.

(10) Patent No.: US 10,763,131 B2
(45) Date of Patent: Sep. 1, 2020

(54) SEMICONDUCTOR DEVICE WITH A MULTI-LAYERED ENCAPSULANT AND ASSOCIATED SYSTEMS, DEVICES, AND METHODS

(71) Applicant: Micron Technology, Inc., Boise, ID (US)

(72) Inventors: Shijian Luo, Boise, ID (US); Jonathan S. Hacker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/817,000

(22) Filed: Nov. 17, 2017

(65) Prior Publication Data

US 2019/0157111 A1  May 23, 2019

(51) Int. Cl.
*H01L 23/498* (2006.01)
*H01L 21/56* (2006.01)
(Continued)

(52) U.S. Cl.
CPC ........ *H01L 21/563* (2013.01); *H01L 23/3157* (2013.01); *H01L 24/16* (2013.01); *H01L 24/29* (2013.01); *H01L 24/73* (2013.01); *H01L 24/81* (2013.01); *H01L 24/91* (2013.01); *H01L 24/83* (2013.01); *H01L 2224/131* (2013.01); *H01L 2224/13082* (2013.01); *H01L 2224/16227* (2013.01); *H01L 2224/26145* (2013.01);
(Continued)

(58) Field of Classification Search
CPC ..... H01L 2924/15311; H01L 2924/014; H01L 2924/181; H01L 2224/73204; H01L 2224/81815; H01L 2224/12105; H01L 2225/1058; H01L 2224/94; H01L 23/3114; H01L 24/03; H01L 2224/32225; H01L 21/563; H01L 24/32; H01L 2224/11462; H01L 24/94; H01L 2224/1132; H01L 23/3157
See application file for complete search history.

(56) References Cited

U.S. PATENT DOCUMENTS 6,335,571 B1   1/2002   Capote et al.
6,774,497 B1   8/2004   Qi et al.
(Continued)

FOREIGN PATENT DOCUMENTS

KR   1020150001769 A   1/2015
TW        560021 B     11/2003
(Continued)

OTHER PUBLICATIONS

International Application No. PCT/US2018/043083—International Search Report and Written Opinion, dated Dec. 24, 2018, 12 pages.
(Continued)

*Primary Examiner* — Farun Lu
(74) *Attorney, Agent, or Firm* — Perkins Coie LLP

(57) ABSTRACT

A semiconductor device includes a substrate including traces, wherein the traces protrude above a top surface of the substrate; a prefill material over the substrate and between the traces, wherein the prefill material directly contacts peripheral surfaces of the traces; a die attached over the substrate; and a wafer-level underfill between the prefill material and the die.

16 Claims, 7 Drawing Sheets

(51) Int. Cl.
*H01L 23/31* (2006.01)
*H01L 23/00* (2006.01)

(52) U.S. Cl.
CPC ........... *H01L 2224/29023* (2013.01); *H01L 2224/73104* (2013.01); *H01L 2224/73204* (2013.01); *H01L 2224/81191* (2013.01); *H01L 2224/81815* (2013.01); *H01L 2224/83007* (2013.01); *H01L 2224/83191* (2013.01); *H01L 2224/83193* (2013.01); *H01L 2224/9211* (2013.01); *H01L 2224/94* (2013.01); *H01L 2924/18161* (2013.01)

(56) References Cited

U.S. PATENT DOCUMENTS

| | | |
|---|---|---|
| 6,960,518 B1 | 11/2005 | Tsao et al. |
| 7,199,479 B2 | 4/2007 | Wu |
| 7,221,059 B2 | 5/2007 | Farnworth et al. |
| 8,836,115 B1 | 9/2014 | St. Amand et al. |
| 2003/0205793 A1 | 11/2003 | Maa et al. |
| 2004/0185601 A1* | 9/2004 | Stepniak ............ H01L 21/563 438/108 |
| 2008/0017408 A1* | 1/2008 | Morishita ............ H01L 21/563 174/260 |
| 2008/0230922 A1 | 9/2008 | Mochizuki et al. |
| 2009/0127718 A1* | 5/2009 | Chen ................... H01L 21/563 257/778 |
| 2011/0049703 A1* | 3/2011 | Hsu ................... H01L 23/49811 257/737 |
| 2011/0074023 A1 | 3/2011 | Supriya et al. |
| 2014/0008786 A1 | 1/2014 | Chen et al. |
| 2014/0048906 A1 | 2/2014 | Shim et al. |
| 2014/0131857 A1 | 5/2014 | Bchir et al. |
| 2015/0147851 A1 | 5/2015 | Feger et al. |
| 2016/0237319 A1 | 8/2016 | Takarada et al. |
| 2016/0284566 A1* | 9/2016 | Kira ....................... H01L 24/83 |
| 2019/0157112 A1 | 5/2019 | Luo et al. |
| 2019/0311918 A1 | 10/2019 | Luo et al. |

FOREIGN PATENT DOCUMENTS

| | | |
|---|---|---|
| TW | M311116 U | 5/2007 |
| TW | 201039415 A | 11/2010 |
| TW | 201403726 A | 1/2014 |

OTHER PUBLICATIONS

TW Patent Application No. 107126789—Taiwanese Office Action and Search Report, dated May 16, 2019, with English Translation, 27 pages.

TW Patent Application No. 107126789—Taiwanese Office Action and Search Report, dated Jan. 22, 2020, with English Translation, 25 pages.

* cited by examiner

SEMICONDUCTOR DEVICE WITH A MULTI-LAYERED ENCAPSULANT AND ASSOCIATED SYSTEMS, DEVICES, AND METHODS

TECHNICAL FIELD

The present technology is related to semiconductor device encapsulants, such as underfills that contact metal traces.

BACKGROUND

Semiconductor devices dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to connect the die to higher level circuitry.

Forming the semiconductor devices can include forming a substrate 102 with traces 104 exposed thereon. As illustrated in FIG. 1, the traces 104 can be exposed based on removing solder mask 106 in solder mask opening area, thereby also exposing a top surface of the substrate top and peripheral surfaces of traces 104.

As further illustrated in FIG. 1, a separately assembled structure, which includes a die 110 with pillars 112 and wafer-level underfill 130 encapsulating the pillars 112 and a surface on the die 110, can be aligned and attached to the substrate 102 and the traces 104. The attachment process can include reforming or reflowing the wafer-level underfill 130 (e.g., such as by controlling the temperature thereof to change its viscosity level), which travels downward as illustrated in FIG. 1 to fill a space between the die 110 and the substrate 102.

As further illustrated in FIG. 2, a resulting semiconductor device 202 (e.g., after reflowing the wafer-level underfill 130 and curing the wafer-level underfill 130 to form an encapsulant) can include the wafer-level underfill 130 filling a space between the die 110 and the substrate 102. The wafer-level underfill 130 can further encapsulate the traces 104. However, due to various factors (e.g., viscosity level of the wafer-level underfill 130, trapped air/gases, uneven flow of the wafer-level underfill 130, space between the traces, etc.), the reflowing process can leave voids 204 directly adjacent to some of the traces 104 (e.g., with portions of the traces 104 failing to directly contact the wafer-level underfill 130). The voids 204 between the traces 104 can cause shorting and leakage between the traces 104, causing an electrical failure for the semiconductor device 202.

DETAILED DESCRIPTION

Figure 1:
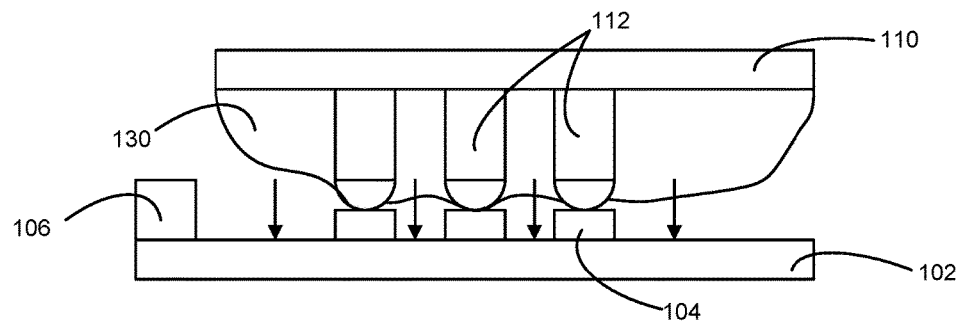
FIG. 1 is a cross-sectional view of a semiconductor device at a selected stage in a manufacturing method in accordance with existing technology.
Figure 2:
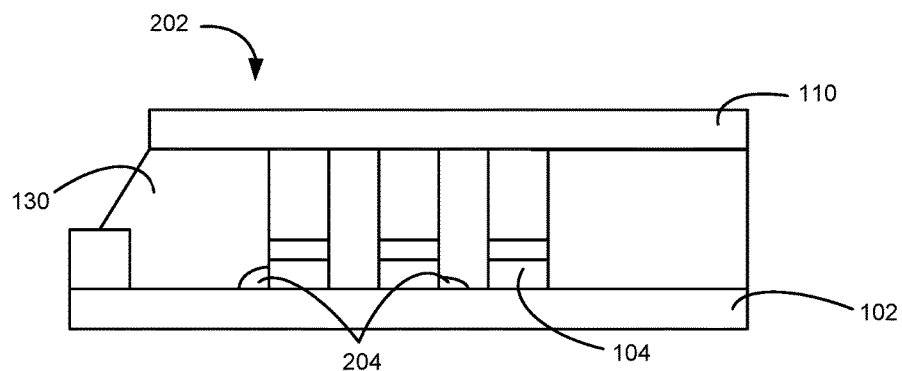
FIG. 2 is a cross-sectional view of a semiconductor device configured in accordance with existing technology.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a wafer-level substrate or to a singulated, die-level substrate, or another die for die-stacking applications. A person having ordinary skill in the relevant art will recognize that suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

Many embodiments of the present technology are described below in the context of encapsulating semiconductor devices or portions thereof, such as for wafer-level underfills. In manufacturing semiconductor devices (e.g., Through-Silicon Via (TSV) die packages), a die structure (e.g., including a TSV die with the wafer-level underfill encapsulating a portion of the TSV die and metal pillars thereon) can be attached to a substrate (e.g., another die in a die-stacking application, printed circuit board, die-level or wafer-level substrate, etc.). Prior to the attaching process (e.g., including connecting the metal pillars with traces on the substrate with solder and reflowing or reforming the wafer-level underfill), a prefill material (e.g., a nonconductive material, such as nonconductive liquid encapsulant or nonconductive paste (NCP), having lower viscosity level than the wafer-level underfill) can be formed (e.g., such as by a deposition process, a jetting process, a dispensing process, a removal process, etc.) directly contacting a portion of the substrate and peripheral sides of the traces. As such, the prefill material can directly contact and attach to the wafer-level underfill during the attaching process, with the combined material filling a space between the die and the substrate. By forming the prefill material on the substrate prior to the attaching process, the manufacturing process can reduce formation of trapped voids (e.g., portions of the trace and/or the substrate not in direct contact with the wafer-level underfill) between metal traces and increase the reliability of the semiconductor device.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 3:
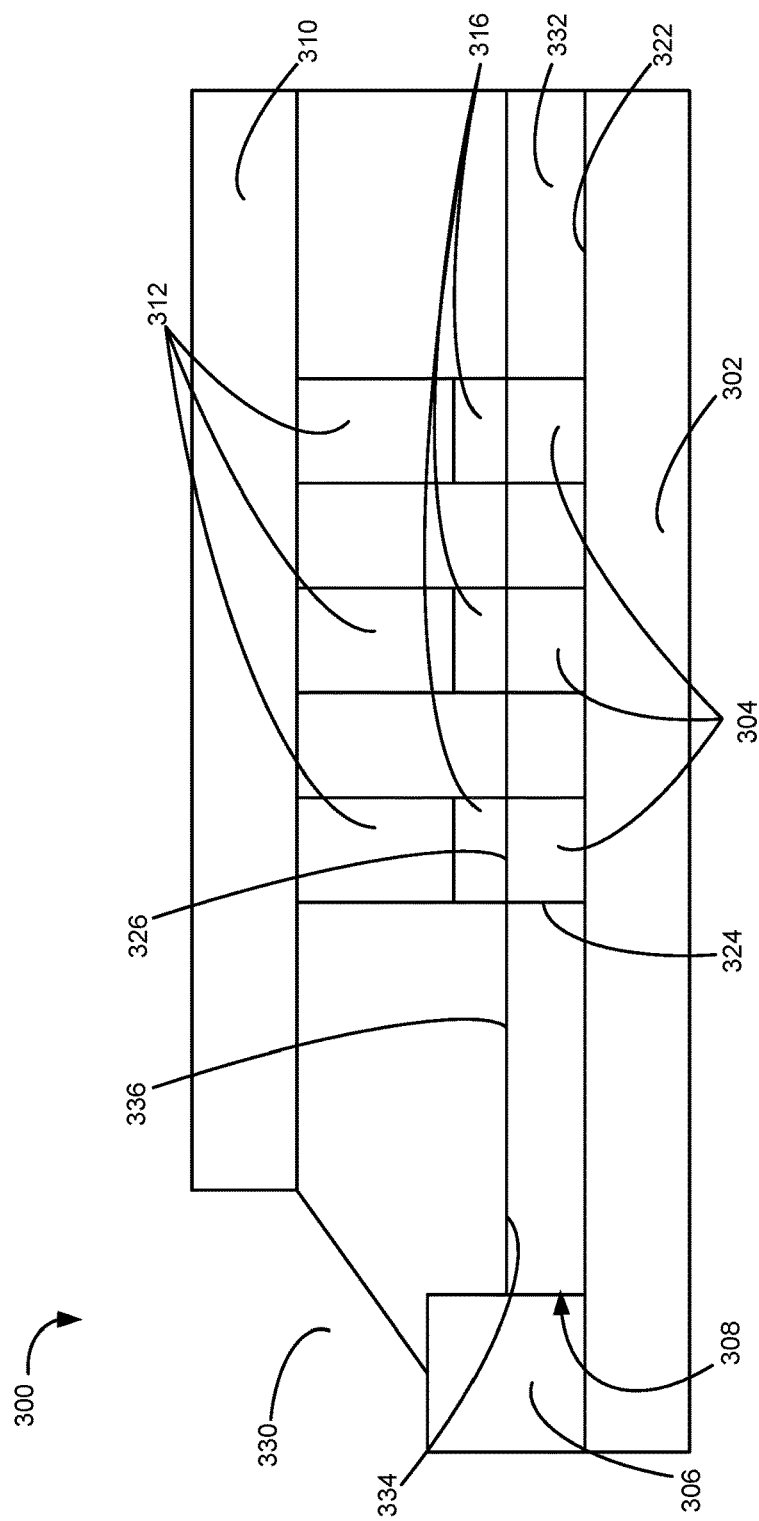
FIG. 3 is a cross-sectional view of a semiconductor device configured in accordance with an embodiment of the present technology.

FIG. 3 is a cross-sectional view of a semiconductor device 300 in accordance with an embodiment of the present technology. The semiconductor device 300 (e.g., a semiconductor die assembly, including a TSV die package) includes a substrate 302 having metal or conductive traces 304 ("traces 304") thereon, and a semiconductor die 310 ("die 310") mounted to the substrate 302.

Conductive or metal pillars 312 ("pillars 312") on the semiconductor die 310 can be connected to the traces 304 through solder 316 to provide electrical connections between the die 310 and the substrate 302. The electrical connections can be located where a solder mask 306 (e.g., solder resist layer or coating) on the substrate 302 has been removed, at least partially, to form a mask opening area 308 and expose top surfaces 326 ("trace top surfaces 326") of the traces 304 from the solder mask 306. For example, the solder mask 306 can have an outside height for portions outside of the mask opening area 308 greater than an inner height for portions inside the mask opening area 308, where the inner height is equal to or less than a height of the traces 304. Also for example, the solder mask 306 can be completely removed in the mask opening area 308 and expose a top surface 322 ("substrate top surface 322") of the substrate 302 and peripheral surfaces 324 ("trace peripheral surfaces 324") of the traces 304.

The semiconductor device 300 further includes wafer-level underfill 330 (e.g., an electrically insulating encapsulant or adhesive material that is applied to the die 310, such as during wafer-level processes) and prefill material 332 (e.g., an electrically insulating material, such as nonconductive liquid encapsulant or nonconductive paste (NCP), that has a lower viscosity level than the wafer-level underfill at a processing step, such as at a specific temperature or based on a different curing agent) in a space between the die 310 and the substrate 302. As illustrated in FIG. 3, the wafer-level underfill 330 can be above the prefill material 332, where the wafer-level underfill 330 directly contacts the pillars 312 and the prefill material 332 can directly contact the traces 304 (e.g., such as on the trace peripheral surfaces 324). Further, the wafer-level underfill 330 can directly contact a bottom surface of the die 310 and the prefill material 332 can directly contact the substrate top surface 322. Also, the wafer-level underfill 330 can directly contact the prefill material 332, such as with an underfill bottom surface 334 directly contacting a prefill top surface 336.

In manufacturing the semiconductor device 300, the prefill material 332 can be formed or applied on the substrate top surface 322 prior to attaching an intermediate structure (e.g. including the die 310, the pillars 312, the solder 316 (e.g., solder bumps), and the wafer-level underfill 330) to the substrate 302 including the traces 304. For example, prior to the attachment process, a nonconductive liquid encapsulant or an NCP can be jetted or dispensed (e.g., using a high precision process to control a location and/or a volume of the prefill material 332) between the traces 304 in the mask opening area 308. The nonconductive liquid encapsulant or the NCP can be jetted or dispensed directly on the substrate top surface 322, the solder mask 306 remaining in the mask opening area 308, the trace peripheral surfaces 324 or a combination thereof. In some embodiments, the prefill material 332 can include or directly contact the solder mask 306 that is not completely removed from the mask opening area 308.

During the manufacturing process, different amounts or volumes of the prefill material 332 can be applied according to a composition or trait of the prefill material 332. As such, the prefill top surface 336 and the underfill bottom surface 334 can be coplanar with, above, or below the trace top surfaces 326.

The prefill material 332 between the traces 304 provides increased reliability for the semiconductor device 300. The prefill material 332 can reduce a downward flow of the wafer-level underfill 330 during the manufacturing process. Further, since the prefill material 332 has a lower viscosity level than the wafer-level underfill 330, the prefill material 332 can reduce voids from forming between the metal traces (e.g., based on leaving a portion of the trace peripheral surfaces 324, a portion of the substrate top surface 322, or a combination thereof exposed from both the solder mask 306 and the wafer-level underfill 330). Accordingly, failure rate for the semiconductor device 300 can be reduced based on reducing the trapped voids.

Figure 4:
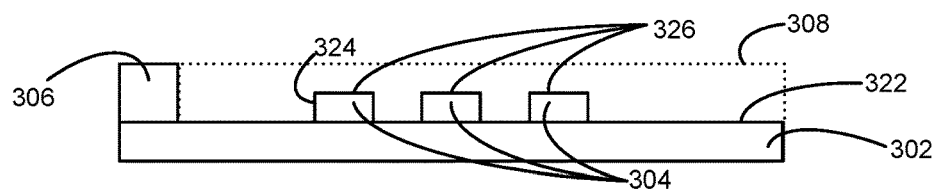
FIGS. 4-7 are cross-sectional views illustrating a semiconductor device at selected stages in a manufacturing method in accordance with an embodiment of the present technology.

FIGS. 4-7 are cross-sectional views illustrating a semiconductor device at a series of selected steps in a manufacturing method in accordance with an embodiment of the present technology. As illustrated in FIG. 4, the method can include providing the substrate 302, such as a printed circuit board (PCB), laminate material, or ceramic material. The substrate 302 can include the traces 304 protruding above the substrate top surface 322. The solder mask 306 can be removed to form the mask opening area 308, thereby exposing the trace peripheral surfaces 324, the trace top surfaces 326, the substrate top surface 322, a portion thereof, or a combination thereof.

Figure 5:
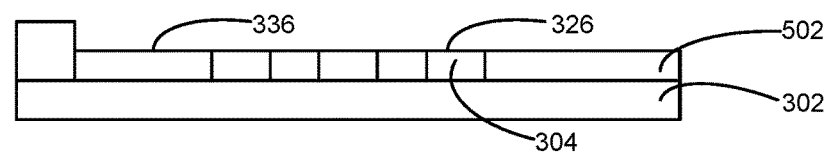

As illustrated in FIG. 5, the method can include a stage for forming the prefill material 332 of FIG. 3 over the substrate 302. For example, the method can include jetting the prefill material 332 (e.g., a nonconductive liquid encapsulant 502 (e.g., epoxy, adhesive, etc.)) between the traces 304. The method can include applying the nonconductive liquid encapsulant 502 directly on the substrate top surface 322 of FIG. 4, the solder mask 306 of FIG. 3 remaining in the mask opening area 308 of FIG. 3, or a combination thereof. The method can include applying the nonconductive liquid encapsulant 502 directly contacting the trace peripheral surfaces 324 of FIG. 3 or a portion thereof.

The method can include a high precision jetting process (e.g., using an applicator with a degree of flow measure/control, with a degree or granularity of applicator locational control, or a combination thereof that satisfies a threshold) that controls an application location for the nonconductive liquid encapsulant 502, a volume of the nonconductive liquid encapsulant 502 at the application location, or a combination thereof. The high precision jetting process can be configured to keep the nonconductive liquid encapsulant 502 away from the trace top surfaces 326, such that the trace top surfaces 326 are not contaminated by the nonconductive liquid encapsulant 502. For example, the high precision jetting process can jet the nonconductive liquid encapsulant 502 at the application location between the traces 304, with the prefill top surface 336 coplanar with or below the trace top surfaces 326.

In some embodiments, the stage for forming the prefill material 332 can include at least partially curing (e.g., based on light exposure, chemical agent, change in temperature, process delay, or a combination thereof) the nonconductive liquid encapsulant 502 before the next manufacturing stage (e.g., attaching a structure including the die 310 of FIG. 3, the wafer-level underfill 330 of FIG. 3, or a combination thereof). In some embodiments, the stage for forming the prefill material 332 can be without a curing process. A viscosity level of the nonconductive liquid encapsulant 502 can remain the same between the stage for forming the prefill material 332 and the next manufacturing stage.

Figure 6:
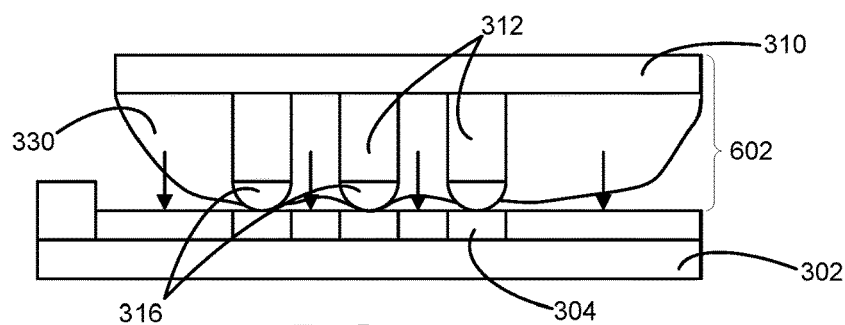

As illustrated in FIG. 6, the method can include a stage for aligning an interim structure 602 with the substrate 302. The interim structure 602 can include the die 310, the pillars 312, the solder 316, the wafer-level underfill 330, or a combination thereof. For example, the interim structure 602 can include the pillars 312 extending away (e.g., shown downward in FIG. 6) from a bottom surface of the die 310. The solder 316 can be attached to or plated on the pillars 312 at a portion or a surface opposite the die 310. The wafer-level underfill 330 can directly contact the bottom surface of the die 310 and encapsulate the pillars 312, the solder 316, a portion thereof, or a combination thereof.

The interim structure 602 can include a structure that is assembled at a separate step or stage in the manufacturing process (e.g., wafer-level manufacturing). For example, the separate step or stage can include forming integrated circuits (ICs) on a wafer, forming the pillars 312 on a surface of the wafer with electrical connections to the ICs, forming the solder bumps on the pillars 312, applying the wafer-level underfill 330, cutting the wafer to form dies, or a combination thereof to assemble the interim structure 602.

The alignment stage can include aligning the interim structure 602 over the substrate 302. For example, the method can include aligning reference portions (e.g., a center portion or a peripheral edge or surface) of specific portions of the traces 304 and of the pillars to be coplanar along a vertical plane or incident along a vertical line. Also for example, the method can include aligning the interim structure 602 and the substrate 302 such that the solder 316 directly contacts the traces 304.

Figure 7:
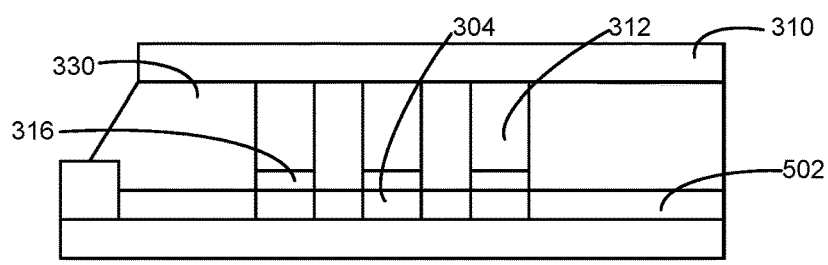

As illustrated in FIG. 7, the method can include a stage for encapsulating the pillars 312 and/or the traces 304 for the semiconductor device 300 of FIG. 3. For example, the method can include reflowing the wafer-level underfill 330 and/or the solder 316. The wafer-level underfill 330 and/or the solder 316 can be reflowed or reshaped based on controlling viscosity levels thereof, such as by controlling the temperature (e.g., increasing the temperature), applying a chemical agent, controlling a processing duration (e.g., processing before a time threshold), or a combination thereof. The wafer-level underfill 330 can be reflowed to directly contact the nonconductive liquid encapsulant 502 (e.g., with the underfill bottom surface 334 of FIG. 3 directly contacting the prefill top surface 336 of FIG. 3), such that a combination of the wafer-level underfill 330 and the nonconductive liquid encapsulant 502 fills a space or separation between the bottom surface of the die 310 and the substrate top surface 322 of FIG. 4. The solder 316 can be reflowed to directly contact the pillars 312 and the traces 304, thereby forming an electrical connection between the die 310 and the traces 304.

Also for example, the method can include curing the wafer-level underfill 330 and/or the nonconductive liquid encapsulant 502, solidifying the solder 316, or a combination thereof. Curing the wafer-level underfill 330 and/or the nonconductive liquid encapsulant 502, solidifying the solder 316, or a combination thereof can include controlling the temperature (e.g., increasing the temperature), applying light, applying a chemical agent, controlling a processing duration (e.g., waiting until after a time threshold), or a combination thereof.

In manufacturing the semiconductor device 300 of FIG. 3, the nonconductive liquid encapsulant 502 can correspond to a viscosity level less than 100 Pa-s (e.g., between 0.01 and 50.0 Pa-S) for one or more manufacturing conditions (e.g., for a specific temperature, before application of a curing agent, or a combination thereof, such as for the forming stage illustrated in FIG. 5 or the reflowing stage illustrated in FIG. 7). For the method, the viscosity level for the nonconductive liquid encapsulant 502 can be lower than a viscosity level of the wafer-level underfill 330 for the one or more manufacturing conditions (e.g., such as for the alignment stage illustrated in FIG. 6 or the reflowing stage illustrated in FIG. 7). Accordingly, the nonconductive liquid encapsulant 502 applied between the traces 304 before attaching the interim structure 602 of FIG. 6 provides increased reliability for the semiconductor device 300. In comparison to filling the space between the traces 304 with the wafer-level underfill 330, the lower viscosity level of the nonconductive liquid encapsulant 502 reduces the trapped voids from forming between the traces 304. The failure rate for the semiconductor device 300 can be reduced based on reducing the trapped voids.

Figure 8:
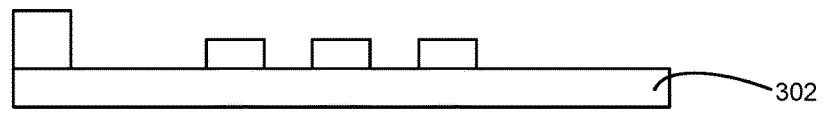
FIGS. 8-11 are cross-sectional views illustrating a semiconductor device at selected stages in a further manufacturing method in accordance with an embodiment of the present technology.

FIGS. 8-11 are cross-sectional views illustrating a semiconductor device at a series of selected stages in a further manufacturing method in accordance with an embodiment of the present technology. As illustrated in FIG. 8, the method can include providing the substrate, similar to the corresponding stage for the method illustrated in FIG. 4.

Figure 9:
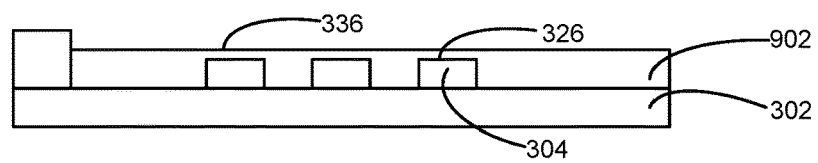

As illustrated in FIG. 9, the method can include a stage for forming the prefill material 332 of FIG. 3 over the substrate 302. For example, the method can include jetting or dispensing the prefill material 332 (e.g., a NCP 902 with fluxing function and a viscosity level for one or more manufacturing conditions) between the traces 304. The method can include applying the NCP 902 directly on the substrate top surface 322 of FIG. 4, the solder mask 306 of FIG. 3 remaining in the mask opening area 308 of FIG. 3, or a combination thereof. The method can include applying the NCP 902 directly contacting the trace peripheral surfaces 324 of FIG. 3 or a portion thereof.

The method can include an application process (e.g., using an applicator with a degree of flow measure/control, with a degree or granularity of applicator locational control, or a combination thereof that satisfies a threshold) that controls an application location for the NCP 902, a volume of the NCP 902 at the application location, or a combination thereof. The application process of the method can be less granular or controlled in comparison to the high precision jetting process. For example, the application process can apply the NCP 902 at the application location between the traces 304, with the prefill top surface 336 coplanar with, above, or below the trace top surfaces 326. As a more specific example, the application process can apply the NCP 902 such that the trace top surfaces 326 or portions thereof are covered by the NCP 902.

In some embodiments, the stage for forming the prefill material 332 can include partially curing (e.g., based on light exposure, chemical agent, change in temperature, process delay, or a combination thereof) the NCP 902 before the next manufacturing stage (e.g., attaching a structure including the die 310 of FIG. 3, the wafer-level underfill 330 of FIG. 3, or a combination thereof). In some embodiments, the stage for forming the prefill material 332 can be without a curing process. A viscosity level of the NCP 902 can remain the same between the stage for forming the prefill material 332 and the next manufacturing stage. In some embodiments, the stage for forming the prefill material 332 can include applying the NCP 902 such that the prefill top surface 336 is below the trace top surfaces 326 and further fully curing the NCP 902 before the next manufacturing stage.

Figure 10:
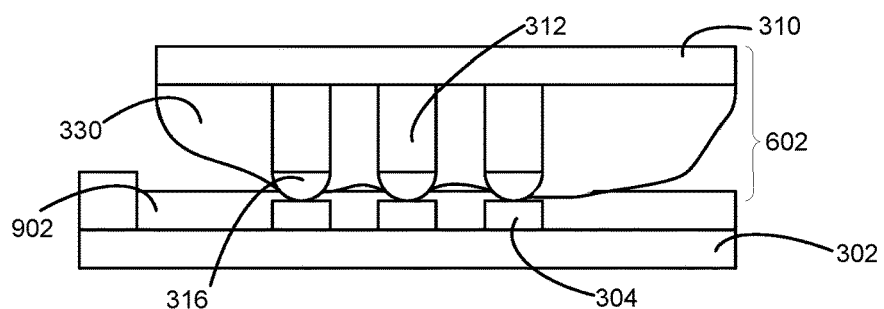

As illustrated in FIG. 10, the method can include a stage for aligning the interim structure 602 with the substrate 302. The alignment stage can be similar to the alignment stage of method illustrated in FIG. 6 (e.g., aligning the pillars 312, the solder 316, and portions of the traces 304 along a vertical line or plane).

The method can further include aligning the interim structure 602 such that the solder 316 directly contacts the trace top surfaces 326. For example, the interim structure 602, the substrate 302, or a combination thereof can be moved such that a distance between the bottom surface of the die 310 and the substrate top surface 322 is reduced until the solder 316 directly contact the trace top surfaces 326. Any NCP (e.g., for NCP formed without fully curing) on the trace top surfaces 326 (e.g., between the trace top surfaces 326 and the solder 316) before the alignment can be removed or pushed out from the trace top surfaces 326 by the solder 316. The NCP 902 can be displaced from the trace top surfaces 326 based on the fluxing function of the NCP 902 as the solder 316 moves closer to the trace top surfaces 326.

Figure 11:
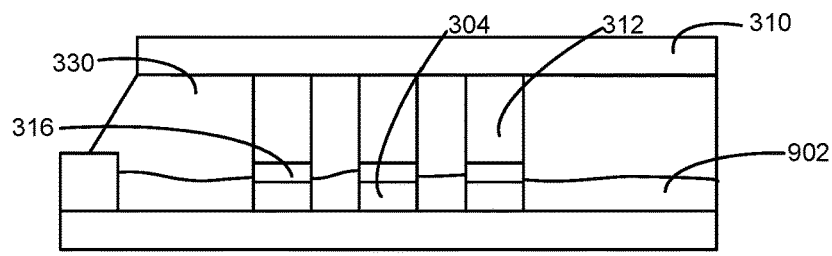

As illustrated in FIG. 11, the method can include a stage for encapsulating the traces 304 and/or the pillars 312 for the semiconductor device 300 of FIG. 3. For example, the method can include reflowing the solder 316 and/or the wafer-level underfill 330 similar to the stage illustrated in FIG. 7. The wafer-level underfill 330 can be reflowed to directly contact the NCP 902 (e.g., with the underfill bottom surface 334 of FIG. 3 directly contacting the prefill top surface 336 of FIG. 3), such that a combination of the wafer-level underfill 330 and the NCP 902 fills a space or separation between the bottom surface of the die 310 and the substrate top surface 322 of FIG. 4. Also for example, the method can include solidifying the wafer-level underfill 330, the solder 316, the NCP 902, or a combination thereof similar to the stage illustrated in FIG. 7.

In manufacturing the semiconductor device 300 of FIG. 3, the NCP 902 can correspond to a viscosity level less than 100 Pa-s (e.g., between 0.01 and 50.0 Pa-S) for one or more manufacturing conditions (e.g., for a specific temperature, before application of a curing agent, or a combination thereof, such as for the forming stage illustrated in FIG. 9 or the reflowing stage illustrated in FIG. 11). For the method, the viscosity level for the NCP 902 can be lower than a viscosity level of the wafer-level underfill 330 for the one or more manufacturing conditions (e.g., such as for the alignment stage illustrated in FIG. 10 or the reflowing stage illustrated in FIG. 11). Accordingly, the NCP 902 applied between the traces 304 before attaching the interim structure 602 of FIG. 6 provides increased reliability for the semiconductor device 300. In comparison to filling the space between the traces 304 with the wafer-level underfill 330, the lower viscosity level of the NCP 902 reduces the trapped voids from forming between the traces 304. The failure rate for the semiconductor device 300 can be reduced based on reducing the trapped voids.

Figure 12:
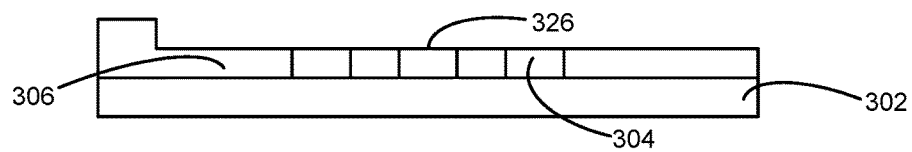
FIGS. 12-14 are cross-sectional views illustrating a semiconductor device at selected stages in a further manufacturing method in accordance with an embodiment of the present technology.
Figure 13:
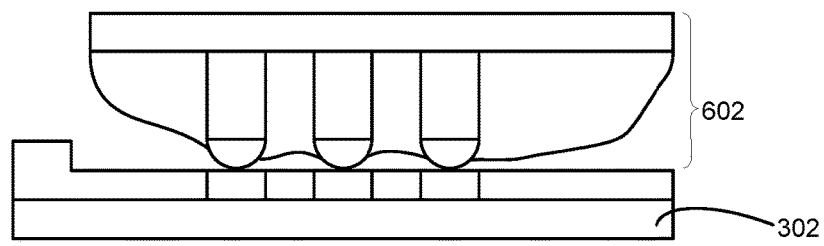
Figure 14:
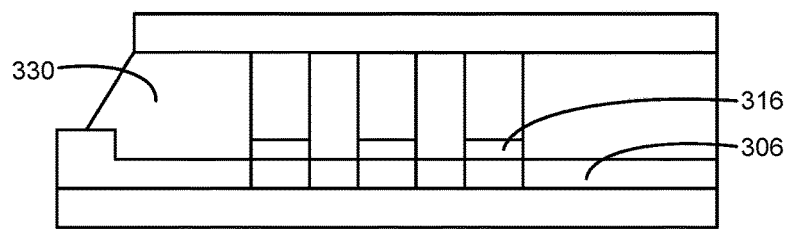

FIGS. 12-14 are cross-sectional views illustrating a semiconductor device at a series of selected stages in a further manufacturing method in accordance with an embodiment of the present technology. As illustrated in FIG. 12, the method can include providing the substrate 302, similar to the corresponding stages in the method as illustrated in FIG. 4 or the method as illustrated in FIG. 8. For the method, the solder mask 306 can be partially removed (e.g., based on reactive ion etching or other anisotropic removal, wet etching or other isotropic removal, etc.) to form the mask opening area 308 of FIG. 3, thereby exposing a portion of the trace peripheral surfaces 324, the trace top surfaces 326, or a combination thereof. For example, the prefill material 332 of FIG. 3 can include the solder mask 306 between the traces 304, with the prefill top surface 336 between the traces 304 coplanar with or below the trace top surfaces 326.

As illustrated in FIG. 13, the method can include a stage for aligning the interim structure 602 with the substrate 302. The alignment stage can be similar to the corresponding stage of the method as illustrated in FIG. 6 or the corresponding stage of the method as illustrated in FIG. 10.

As illustrated in FIG. 14, the method can include a stage for encapsulating the pillars 312 of FIG. 3 and/or the traces 304 of FIG. 3 for the semiconductor device 300 of FIG. 3. For example, the method can include reflowing the solder 316 and the wafer-level underfill 330 similar to the stage illustrated in FIG. 7 or FIG. 11. The wafer-level underfill 330 can directly contact the solder mask 306.

In some embodiments, the method can include a stage for forming the prefill material 332 of FIG. 3 using a combination of the solder mask 306 and the nonconductive liquid encapsulant 502 of FIG. 5 or the NCP 902 of FIG. 9. For example, the method can include partially removing the solder mask 306 such that top surfaces of the solder mask 306 between the traces 304 are below the trace top surfaces 326 of FIG. 3. The method can further include forming the nonconductive liquid encapsulant 502 or the NCP 902 directly on the top surfaces of the solder mask 306 and between the traces. The forming stage can be similar to the corresponding stage illustrated in FIG. 5 or FIG. 9.

Figure 15:
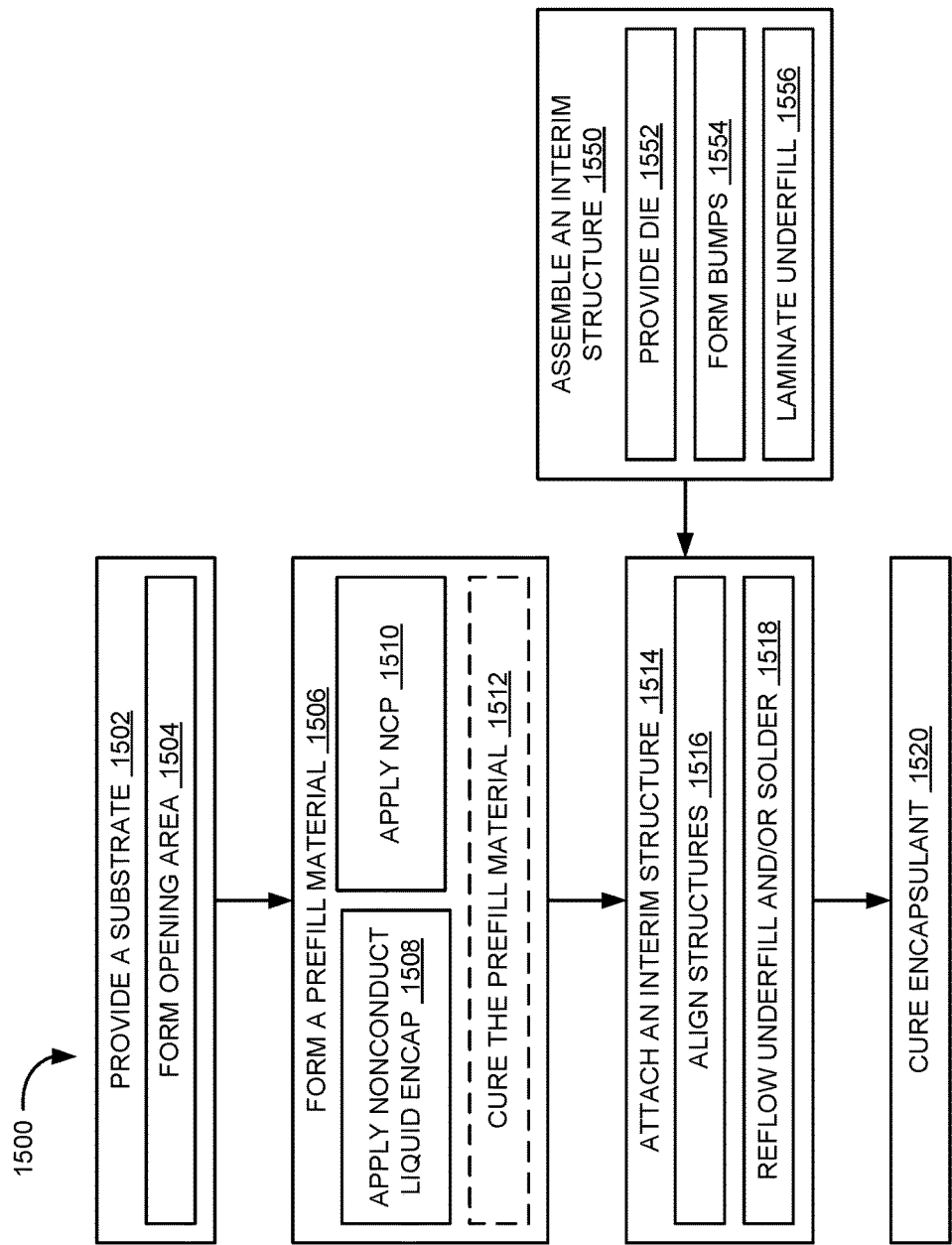
FIG. 15 is a flow diagram illustrating an example method of manufacturing a semiconductor device in accordance with an embodiment of the present technology.

FIG. 15 is a flow diagram illustrating an example method 1500 ("method 1500") of manufacturing a semiconductor device in accordance with an embodiment of the present technology. For example, the method 1500 can be used to manufacture the semiconductor device 300 of FIG. 3. Also for example, the method 1500 can include stages illustrated in FIGS. 4-14.

The method 1500 can include providing a substrate (e.g., the substrate 302 of FIG. 3), as illustrated at block 1502. The provided substrate 302 can include the traces 304 of FIG. 3 protruding from the substrate top surface 322 of FIG. 3. For example, the providing step can correspond to the stages illustrated in FIG. 4, 8, or 12.

Providing the substrate can include forming an opening area (e.g., the mask opening area 308), as illustrated in block 1504, based on at least partially removing the solder mask 306 of FIG. 3. For example, the solder mask 306 can be removed (e.g., based on reactive ion etching or other anisotropic removal, wet etching or other isotropic removal, etc.) in the locations designated to be the mask opening area 308 such that the remaining solder mask 306 has a top surface (e.g., the top surface of the solder mask 306 between the traces 304) that is either coplanar with or below the trace top surfaces 326 of FIG. 3. In some embodiments, the solder mask 306 can be removed completely, thereby exposing the substrate top surface 322 in the mask opening area 308.

The method 1500 can further include forming a prefill material (e.g., the prefill material 332, such as the nonconductive liquid encapsulant 502 of FIG. 5, the NCP 902 of FIG. 9, the remaining solder mask 306, or a combination thereof) as illustrated in block 1506. The prefill material 332 can be formed over the substrate 302 and between the traces 304. The prefill material 332 can directly contact the trace peripheral surfaces 324 of FIG. 3. Forming the prefill material can correspond to the stages illustrated in FIGS. 5, 9, 12, or a combination thereof.

In some embodiments, forming the prefill material 332 can include applying the nonconductive liquid encapsulant 502 as illustrated in block 1508. Corresponding to FIG. 9, the nonconductive liquid encapsulant 502 can be applied directly contacting the solder mask 306, the substrate top surface 322, trace peripheral surfaces 324, or a combination thereof in the mask opening area 308. The nonconductive liquid encapsulant 502 can be applied using a jetting process (e.g. a high precision jetting process) that controls a location in jetting the nonconductive liquid encapsulant 502, a volume of the nonconductive liquid encapsulant 502 at the location, or a combination thereof. The high precision jetting process can have a level of control or granularity, such that the nonconductive liquid encapsulant 502 is kept away from the trace top surfaces 326 during the application process (e.g., based on controlling the location and the volume). Moreover, the prefill top surface 336 of FIG. 3 corresponding to the nonconductive liquid encapsulant 502 can be coplanar with or below the trace top surfaces 326.

In some embodiments, forming the prefill material 332 can include applying the NCP 902 as illustrated in block 1510. Corresponding to FIG. 9, the NCP 902 can be applied (e.g., using a jetting process or a dispensing process) directly contacting the solder mask 306, the substrate top surface 322, trace peripheral surfaces 324, or a combination thereof in the mask opening area 308. Based on its fluxing function, the NCP 902 can be applied without regards to keeping the trace top surfaces 326 clear of the NCP 902. For example, the NCP 902 can be applied such that some of the material ends up directly contacting at least a portion of one or more of the trace top surfaces 326. Also for example, the NCP 902 can be applied such that the prefill top surface 336 corresponding to the NCP 902 is coplanar with or above the trace top surfaces 326.

In some embodiments, forming the prefill material 332 can include partially or fully curing (e.g., based on a chemical agent, an exposure to light, a time delay, or a combination thereof) the prefill material 332 (e.g., the nonconductive liquid encapsulant 502 and/or the NCP 902) as illustrated in block 1512. In some embodiments, the prefill material 332 can be formed without the curing process.

The method 1500 can further include attaching an interim structure (e.g., the interim structure 602 of FIG. 6) to the substrate 302 and the traces 304 as illustrated in block 1514. The interim structure 602 can be assembled at a separate or preceding stage as illustrated in block 1550. For example, as illustrated in block 1552, assembling the interim structure 602 can include providing the die 310 of FIG. 3 with the pillars 312 of FIG. 3 extending or protruding from a bottom surface of the die 310. As illustrated in block 1554, the assembling stage can further include forming solder bumps (e.g., the solder 316 of FIG. 3) on the pillars 312 at a portion opposite the die 310. As illustrated in block 1556, the assembling stage can include laminating the wafer-level underfill 330 of FIG. 3 on the bottom surface of the die 310, such that the wafer-level underfill 330 directly contacts and encapsulates the bottom surface and the pillars 312. Assembling the interim structure 602 can further include dicing or singulating (not shown) the die 310 from the wafer structure.

Attaching the interim structure 602 (e.g., a structure resulting from the assembling stage 1550) can include aligning the structures, as illustrated in block 1516. The alignment process can correspond to the stage illustrated in FIG. 6, 10, or 13. For example, the alignment process can align such that the pillars 312 and corresponding portions of the traces 304 are coincident along corresponding vertical lines. Also for example, the alignment process can align such that the solder 316 directly contacts the trace top surfaces 326. In some embodiments, as the solder 316 is brought closer to the trace top surfaces 326 or as the solder 316 spreads horizontally during the subsequent reflowing stage, the NCP 902 on the trace top surfaces 326 can be removed or pushed out from the trace top surfaces 326 based on the flux function of the NCP 902.

Attaching the interim structure 602 can further include reflowing the wafer-level underfill 330 and/or the solder 316 as illustrated in block 1518. The reflowing process can correspond to the stage illustrated in FIG. 7, 11, or 14. The reflowing process can include controlling the temperature, applying or removing a chemical agent or an exposure to light, controlling a processing time relative to a threshold duration, etc. With the wafer-level underfill 330 over the prefill material 332 and the solder 316 over the trace top surfaces 326, the reflowing process can have the wafer-level underfill 330 directly contact the prefill material 332 (e.g., such that the underfill bottom surface 334 is coplanar with the prefill top surface 336) and have the solder 316 directly contact and cover corresponding portions of the trace top surfaces 326.

The attaching process can take place after curing the prefill material 332. In some embodiments (e.g., such as where forming the prefill material 332 excludes the curing process), the attaching process can take place without curing the prefill material 332.

The method 1500 can further include curing the encapsulant as illustrated in block 1520. The curing process can be based on applying a chemical agent, exposing the structure to a specific light, controlling the temperature, waiting a threshold amount of time, or a combination thereof. The curing process can cure the wafer-level underfill 330, the prefill material 332, or a combination thereof.

Figure 16:
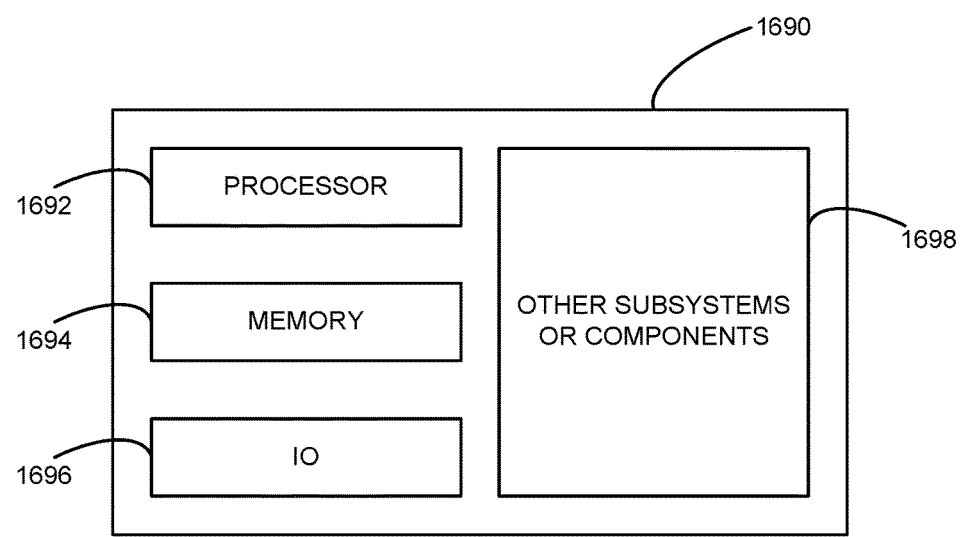
FIG. 16 is a block diagram illustrating a system that incorporates a semiconductor device in accordance with embodiments of the present technology.

FIG. 16 is a block diagram illustrating a system that incorporates a semiconductor device in accordance with embodiments of the present technology. Any one of the semiconductor devices having the features described above with reference to FIGS. 1-15 can be incorporated into any of a myriad of larger and/or more complex systems, a representative example of which is system 1690 shown schematically in FIG. 16. The system 1690 can include a processor 1692, a memory 1694 (e.g., SRAM, DRAM, flash, and/or other memory devices), input/output devices 1696, and/or other subsystems or components 1698. The semiconductor assemblies, devices, and device packages described above with reference to FIGS. 1-15 can be included in any of the elements shown in FIG. 16. The resulting system 1690 can be configured to perform any of a wide variety of suitable computing, processing, storage, sensing, imaging, and/or other functions. Accordingly, representative examples of the system 1690 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 1690 include lights, cameras, vehicles, etc. With regard to these and other examples, the system 1690 can be housed in a single unit or distributed over multiple interconnected units, e.g., through a communication network. The components of the system 1690 can accordingly include local and/or remote memory storage devices and any of a wide variety of suitable computer-readable media.

From the foregoing, it will be appreciated that specific embodiments of the present technology have been described herein for purposes of illustration, but that various modifications may be made without deviating from the disclosure. In addition, certain aspects of the disclosure described in the context of particular embodiments may be combined or eliminated in other embodiments. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

We claim:

1. A semiconductor device, comprising:
   a substrate including traces, wherein the traces protrude above a top surface of the substrate;
   a prefill material over the substrate and between the traces, wherein:
      the prefill material directly contacts peripheral surfaces of the traces,
      the prefill material corresponds to a first viscosity level for a manufacturing condition,
      the prefill material includes a nonconductive liquid encapsulant;
   a die attached over the substrate; and
   a wafer-level underfill between the prefill material and the die, the wafer-level underfill corresponding to a second viscosity level for the manufacturing condition;
   wherein:
      the first viscosity level is lower than the second viscosity level; and
      the prefill material includes solder mask with a top surface that is coplanar with or below one or more top surfaces of the traces located between peripheral edges of the die.

2. The semiconductor device of claim 1 wherein the prefill material includes a nonconductive paste (NCP).

3. The semiconductor device of claim 2 wherein the NCP includes a fluxing function or trait.

4. The semiconductor device of claim 2 wherein the NCP has a top surface that is coplanar with or above one or more top surfaces of the traces.

5. The semiconductor device of claim 1 wherein the nonconductive liquid encapsulant has a top surface that is coplanar with or below one or more top surfaces of the traces.

6. The semiconductor device of claim 1 wherein the prefill material directly contacts the wafer-level underfill.

7. The semiconductor device of claim 1 wherein:
   the prefill material directly contacts the top surface of the substrate;
   the die includes a bottom surface and pillars protruding from the die, wherein the pillars are electrically coupled to the traces; and
   the wafer-level underfill directly contacts the bottom surface of the die and the pillars.

8. A method of manufacturing a semiconductor device, comprising:
   providing a substrate including traces, wherein the traces protrude above a top surface of the substrate;
   forming a prefill material over the substrate and between the traces based on jetting a nonconductive liquid encapsulant between the traces, wherein
   the prefill material directly contacts peripheral surfaces of the traces; and
   jetting the nonconductive liquid encapsulant includes jetting the nonconductive liquid encapsulant with a top surface thereof coplanar with or below top surfaces of one or more of the traces located between peripheral edges of the die; and
   attaching an interim structure to the substrate over the prefill material, wherein the interim structure includes a die and a wafer-level underfill between the die and the prefill material.

9. The method of claim 8 wherein jetting the nonconductive liquid encapsulant includes using a high precision jetting process for controlling a location in jetting the nonconductive liquid encapsulant, a volume of the nonconductive liquid encapsulant at the location, or a combination thereof.

10. The method of claim 9 wherein jetting the nonconductive liquid encapsulant includes keeping the nonconductive liquid encapsulant away from top surfaces of the traces.

11. The method of claim 8 further comprising at least partially curing the nonconductive liquid encapsulant before attaching the interim structure.

12. The method of claim 8 wherein attaching the interim structure includes attaching the interim structure without curing the nonconductive liquid encapsulant.

13. The method of claim 8 further comprising at least partially removing a solder mask from between the traces.

14. The method of claim 13 wherein the solder mask between the traces are coplanar with or below top surfaces of one or more of the traces.

15. The method of claim 8 further comprising assembling the interim structure including:
   providing the die including pillars extending from a bottom surface of the die;
   forming solder bumps on the pillars opposite the die; and
   laminating the wafer-level underfill directly contacting the bottom surface and pillars.

16. The method of claim 15 wherein attaching the interim structure includes reflowing the solder bumps and the wafer-level underfill, wherein the solder bumps directly contact the traces and the pillars and the wafer-level underfill directly contacts the prefill material.

* * * * *